United States Patent [19]

Steiner

[11] Patent Number: 5,617,292
[45] Date of Patent: Apr. 1, 1997

[54] TWO PIECE CLIP FOR HEAT DISSIPATING ASSEMBLIES

[75] Inventor: Ronald E. Steiner, Agoura Hills, Calif.

[73] Assignee: International Electronic Research Corporation, Burbank

[21] Appl. No.: 528,344

[22] Filed: Sep. 14, 1995

[51] Int. Cl.[6] .................................................. H05K 7/20
[52] U.S. Cl. .......................... 361/704; 24/457; 174/16.3;
  257/719; 248/510
[58] Field of Search .............................. 24/457; 174/16.3;
  257/706, 707, 713, 718–719, 726–727;
  248/505, 510; 361/704, 707, 709–711, 717–718,
  722

[56] References Cited

U.S. PATENT DOCUMENTS

| | | |
|---|---|---|
| 4,587,595 | 5/1986 | Staples . |
| 5,302,853 | 4/1994 | Volz et al. . |
| 5,357,404 | 10/1994 | Bright et al. . |
| 5,371,652 | 12/1994 | Clemens et al. . |
| 5,436,798 | 7/1995 | Wieland, Jr. . |
| 5,448,449 | 9/1995 | Bright et al. . |
| 5,486,981 | 1/1996 | Blomquist .............................. 174/16.3 |

*Primary Examiner*—Gregory D. Thompson
*Attorney, Agent, or Firm*—Bruce A. Jagger

[57] ABSTRACT

A two piece spring clip for holding a heat dissipating assembly together. The spring clip includes an elongated leaf spring member having a free end and a leg segment remote from the free end, and a separate leg member. The free end and the separate leg member define therebetween a leg engaging mechanism and are hingedly engaged with one another by the leg engaging mechanism. A bearing element is mounted on one of the free end or separate leg member. The bearing element bears on the free end or separate leg member to which it is not mounted so as to limit the arc through which the separate leg member may hingedly swing. Several bearing elements may be provided, if desired.

7 Claims, 3 Drawing Sheets

TWO PIECE CLIP FOR HEAT DISSIPATING ASSEMBLIES

BACKGROUND OF THE INVENTION

1. Field of the Invention

The invention relates in general to heat dissipating assemblies and, in particular, to an improved two piece clip for maintaining a heat dissipating element in heat transferring relationship with an electronic device such as an electronic chip used in computers.

2. Description of the Prior Art

In order to safely operate many of today's computers and other electronic devices, heat must be removed from components which generate large amounts of heat and which cannot dissipate the heat fast enough to avoid harmful consequences. One method for dissipating the accumulating heat of an electronic device is to force air over the device, thereby removing the heat by convection. This method has been substantially improved by attaching a heat dissipating device to the electronic device wherein the heat dissipating device is designed to dissipate heat at a significantly greater rate than the electronic device alone. Such a device typically has projections such as pins or fins, exposing a greater surface area to the flow of air for greater dissipation of heat. Hinshaw U.S. Pat. Nos. 4,884,331 and 4,879,891 disclose one type of pinned and finned heat sink.

When the heat dissipating device is placed in contact with the electronic device, the electronic device transfers heat by conduction to the heat dissipating device which then dissipates accumulating heat by convection. This method has become standard among the computer industry for dissipating the large amounts of heat generated by the new generation of computer processors.

Many different methods have been used to secure the heat dissipating device to the electronic device, including the use of clips to fasten the assembly together. Clips generally extend over the heat sink and attach at each end to the electronic device or its socket at specially provided ports or bosses. Such one piece clips are illustrated for example in the heat dissipating assemblies described in Blomquist U.S. Pat. No. 5,208,731, issued May 4, 1993, and Blomquist U.S. patent application Ser. No. 08/289,925, filed Aug. 12, 1994, now U.S. Pat. No. 5,486,981. It is preferred that any securing method devised allow for quick and easy attachment and removal of the heat dissipating device while providing a secure attachment during operation and normal handling. Electronic devices must be removed and replace from time to time, and so it is necessary that the heat dissipating assembly should be easy to remove and install without sacrificing reliability or effectiveness. Clips offer the advantage of being inexpensive, simple, operational over a multiple number of assembles and disassembles, and reasonably secure so that the heat dissipating device does not disconnect or dislodge from the electronic device.

Previous heat dissipating assemblies utilizing a two piece clip as a fastening means had generally lacked sufficient rigidity and strength, particularly at the junction between the two parts of the clip, and separation of the assembly had been a potential risk. In general, prior two piece clips had been constructed so that the intersection of the separate leg and the leaf spring member formed a loose hinge about which rotation at least to some degree in several directions was possible. Thus, the force holding the assembly together was exerted substantially entirely in a direction normal to the electronic component. The hinge mechanism was relatively weak and prone to failure, particularly under prolonged use and shock and vibration. Holding the necessary tolerances during manufacturing imposed additional difficulty in producing prior two piece clips.

These and other difficulties of the prior art have been overcome according to the present invention.

BRIEF SUMMARY OF THE INVENTION

A preferred embodiment of the two piece clip for maintaining a heat conducting body in heat exchanging relationship with an electronic device according to the present invention, for example, comprises an elongated leaf spring member with an integral leg segment, a separate leg member, and stops at the intersection of the two pieces to limit rotation and effectuate the proper force applied on the electronic device to provide a strong reliable heat dissipating assembly. The two piece clip as referred to in the description of prior art is greatly and unexpectedly improved by adding a combination of reinforcing flaps and tabs on one or both of the leaf spring and the separate leg which act as stop elements to strengthen and stabilize the clip and, therefore, the heat dissipating assembly as a whole. By appropriate adjustment of the stop elements the two piece structure may be made to exert a holding force in more than just a direction normal to the heat dissipating assembly. By extruding the material displaced to make the leg engaging mechanism, i.e., the notches, slot, and prongs, and using the material as support structures to resist rotation of the separate leg member, the clip is strengthened without the need for additional material.

BRIEF DESCRIPTION OF THE DRAWINGS

Referring particularly to the drawings for the purposes of illustration only and not limitation.

DETAILED DESCRIPTION OF THE PREFERRED EMBODIMENTS

Figure 4:
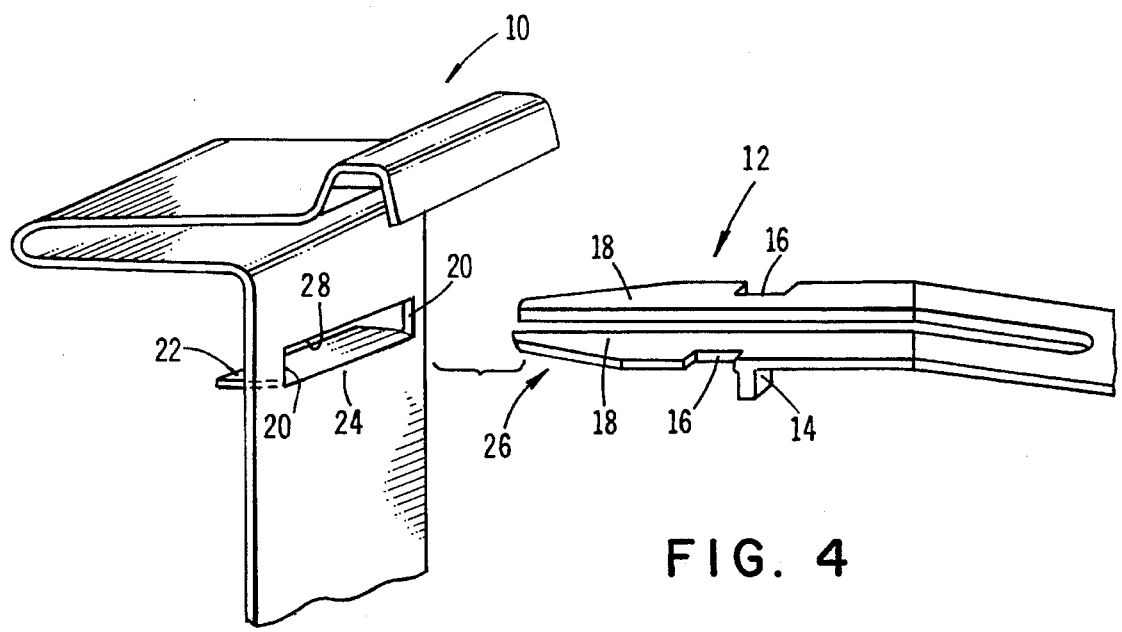
FIG. 4 is an enlarged partial perspective view of a preferred embodiment of the strengthened hinge mechanism according to the present invention.

Referring particularly to the accompanying drawings which illustrate only those preferred embodiments which have been selected for purposes of illustration, and not all possible embodiments, there is illustrated in FIG. 4 generally at 10 a separate leg member and at 12 an elongated leaf spring element.

Figure 1:
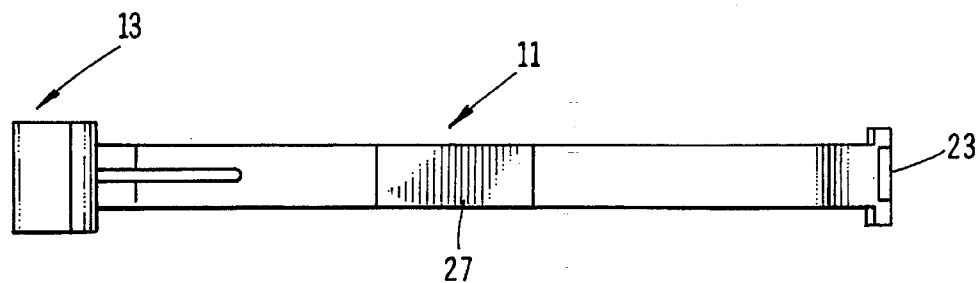
FIG. 1 is a plan view of a two piece clip of the prior art.
Figure 2:
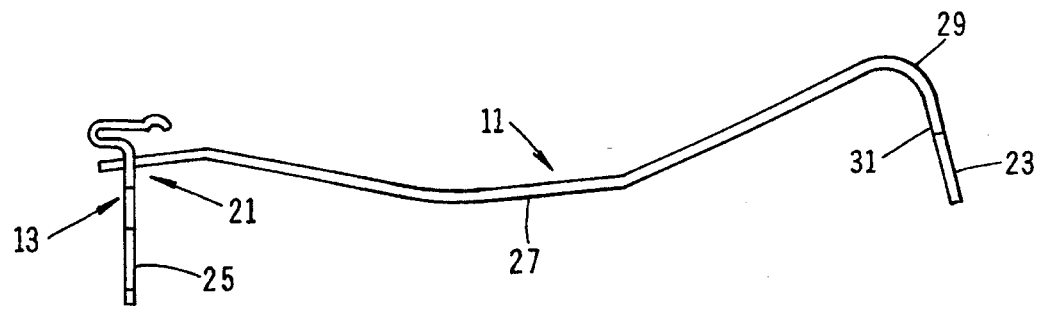
FIG. 2 is an elevational view of the two piece prior art clip of FIG. 1.
Figure 3:
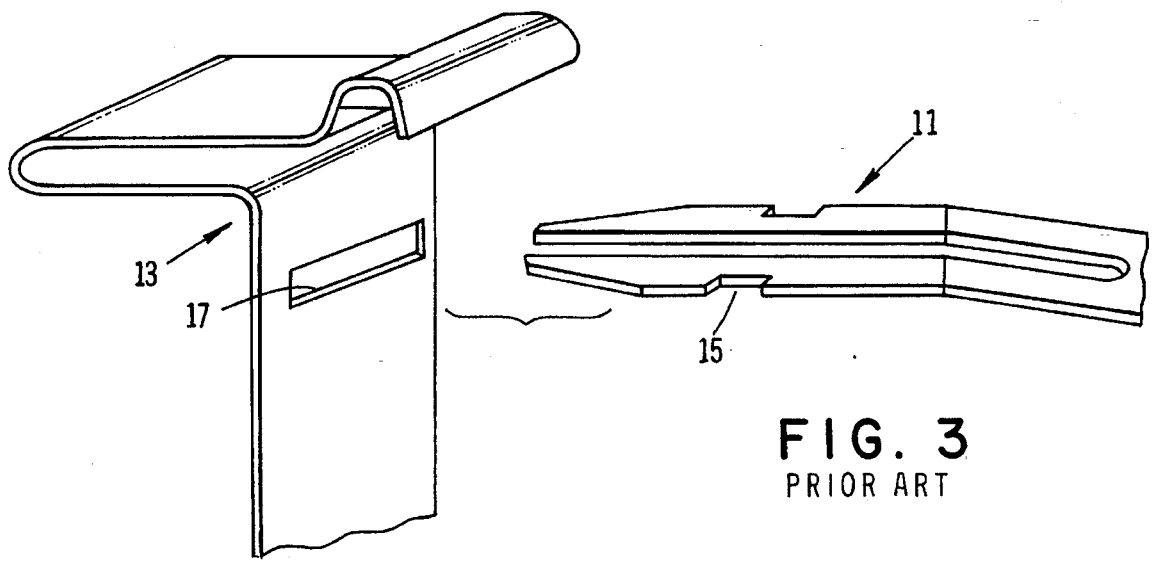
FIG. 3 is an enlarged partial perspective view of the hinge mechanism of the two piece prior art clip of FIG. 1.

In the prior art, illustrated, for example, in FIGS. 1, 2 and 3, an elongated leaf spring member 11 and a separate leg member 13, intersect using a notch 15 and slot 17 arrangement to form a two piece clip which mounts in a conventional way through mounting elements or ports 23 and 25 to conventional mating locations or projections, not shown, on a conventional socket, not shown, for an electronic device. The mounting elements 23 and 25 are generally disposed on opposed sides of the assembly. Such a conventional socket with mounting elements and locations is illustrated and described, for example, in Blomquist U.S. patent application Ser. No. 08/289,925, filed Aug. 12, 1994, which is hereby incorporated herein by reference. The elongated leaf spring member 11 includes a shaped leaf segment 27, a spring loop segment 29, and a leg segment 31 integral with the spring loop segment. The two piece clip of FIG. 1 supplies a normal force to a heat dissipating device to hold it in an assembled configuration with the electronic device. The strength of the hinge area 21 is limited.

The elongated leaf spring member 12 of the clip, according to the present invention, has one free end indicated generally at 26 which is tapered and forked, forming two flat spaced apart prongs 18 which narrow at its end. The pronged free end 26 is designed to pass through an open slot 28 on the separate leg member 10 to provide a leg engaging mechanism. As the tapered free end 26 of the leaf spring member 12 passes through the slot 28, the opposed slots 16 on the opposed edges of prongs 18 engage the adjacent side edges of slot 28 in separate leg element 10. In the engaged configuration the free end 26 and separate leg member 10 are in a hinged configuration allowing the separate leg member 10 to rotate about the free end 26 elongated leaf spring member 12. In a preferred embodiment, the spaced apart tapered prongs 18 are compressed together by the sides 20 of the slot as the free end 26 of elongated leaf spring member 12 passes axially though the slot 28. The compression of the prongs 18 creates an outward force against the sides 20 of the slot 28, which increases as the prongs act like cantilevers being displaced farther and farther from the static position.

At some point along the tapered section of the elongated leaf spring member, or within close proximity to the tapered section, the outer edges of the elongated leaf spring member have opposed notches 16 for catching the sides 20 of the slot 28 on the separate leg member 10. As the notches 16 pass through the sides of the slot 28, the compressed prongs 18 release and expand to trap the elongated leaf spring member 12 inside the separate leg member's slot 28. Once the elongated leaf spring member 12 is captured in the slot 28, it cannot pass farther or be removed from the separate leg member. This secure positioning occurs as a result of the notch's sides abutting against the separate leg member's front and back surfaces adjacent edges 20.

In this configuration, there is generally play between the height of slot 28 and the thickness of the free end 26, allowing for some rotation of the separate leg member 10 through an arc of approximately 30 degrees or more about the free end 26 of elongated leaf spring member 12, as well as some rotation of member 10 about the longitudinal axis of member 12. The separate prongs offer less resistance to axial rotation than would be offered by a solid member. Some rotation also occurs around the longitudinal axis of the separate leg member 10. If left unrestrained, this rotation results in some instability. The unwanted rotation weakens the interengagement of the clip on the electronic device or its socket and provides for the possibility that the clip may disconnect during handling or transportation. The only bearing surface present in the prior art is the intersecting thicknesses of the two pieces, i.e., the thickness of the separate leg member 13 and the thickness of the elongated leaf spring member 11, which requires exacting tolerances to achieve the desired lateral forces and restrict rotation of the separate leg member. The exacting tolerances are generally impracticable for a clip of this size, material, and cost, and difficult to achieve under the best of circumstances.

The prior art, as illustrated, for example, in FIG. 1, is inherently unstable because the intersection of the two pieces is unsupported by any reinforcing components. According to the present invention bearing surfaces or stops are deployed on the respective members which provide more resistance to rotation than that which is provided by the mere thicknesses of the intersecting pieces. The stop elements serve to limit the relative rotation between the separate leg member and the free end 26. By creating flaps and tabs to bear against the separate leg member 10 and the elongated leaf spring member 12, rotation can easily be limited to heretofore unavailable ranges. Bearing surfaces can be used to stabilize the separate leg member against both planer and axial rotation. Adjustments in the positions of the bearing locations which are sufficient to control the rotation of the separate leg member can be made without imposing overly exacting tolerance requirements. The contact locations provided by the stop elements can be adjusted to provide the application of forces by the clip in other than a direction normal to the heat dissipating assembly. In this manner, the required forces on the heat dissipating assembly can be easily adjusted to and maintained at the optimum value even with extensive usage.

A preferred embodiment of the clip for securing a heat conducting body to an electronic device comprises the elongated leaf spring member 12 and the separate leg member 10 wherein flaps and tabs are added to stabilize the configuration and prevent any unwanted rotation of the separate leg member relative to the elongated leaf spring element. The first embodiment of the invention, as depicted, for example, in FIG. 4, comprises a set of flaps 14 projecting outwardly from the surface of the prongs at the back of the notches 16. The flaps 14 are positioned, for example, generally parallel to the surface of the separate leg member 10 and abut the separate leg member's face in the assembled configuration. When the flaps 14 project generally normal to the longitudinal axis of free end 26 they act to bring the separate leg member 10 into a position which is generally normal to the longitudinal axis of free end 26. Adjusting the angle at which flaps 14 depend from free end 26 will cause the angle of repose between members 10 and 12 to change. The effectiveness of the flaps increases as the lengths of the flaps 14 increase because of increasing leverage. Closer control of the angle of repose may also be achieved by lengthening the flaps 14.

The flaps 14 at the back of the notch 16 contact the separate leg member's face and provide support against excessive rotation around free end 26 and the longitudinal axis of the leg member 10. The flaps 14 may be easily formed by bending the extruded material removed in order to form the notch 16 so that the flaps 14 will contact the separate leg member 10 when the notches 16 engage the slot sides 20.

In order to prevent rotation by the separate leg member 10 axially of the free end 26, a preferred embodiment comprises a tab 22 projecting from the separate leg member 10 at the location of the base 24 of the slot 28. The tab extends from the face of the separate leg member 10 which is not in contact with the flap 14 and generally normal to the surface. The angles at which flaps 14 and tab 22 project should be coordinated so as to establish the angle of repose between the free end 26 and separate leg 10. As the normally lower face of the pronged end of the leaf spring element 12 is passed through the slot 28, it contacts the tab 22 on the other side of the slot 28 and is supported by the tab 22. The tab 22 also deters axial rotation of the separate leg member 10 about the elongated leaf spring element 12. As with the flaps 14, the tab 22 can be varied in length and angle relative to the face of the separate leg member to form a two point or area contact and the two points can be used to linearly determine the remote end of the separate leg member. By positioning the remote end of the separate leg member relative to the elongated leaf spring member using flaps and tabs, the lateral forces which result from usage may be optimized.

In a preferred embodiment, the tab 22 is formed by bending outward the material which is removed in the creation of the slot 28 so that when projected through slot 28 the leaf spring element 12 engages tab 22. With the flaps 14 and tab 22 working in conjunction with each other, rotation of the arm is controlled in several directions and the resulting clip is substantially more secure and rigid. Moreover, the improvement can accomplished without any additional materials because the supports or stops are formed from the otherwise discarded scrap material.

Figure 5:
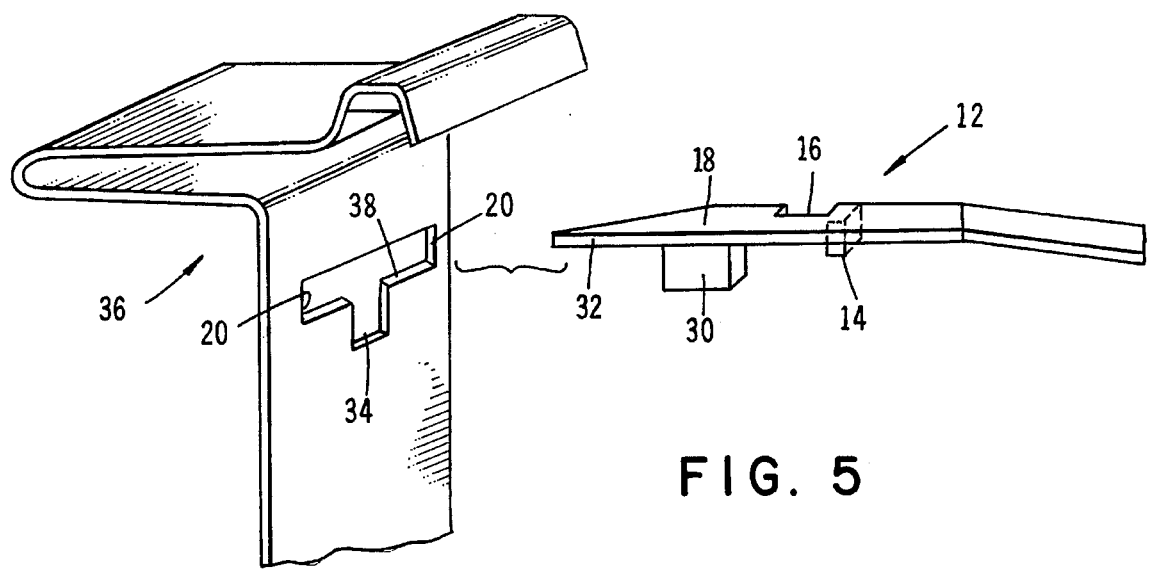
FIG. 5 is an enlarged partial perspective view of an additional preferred embodiment of the strengthened hinge mechanism according to the present invention.
Figure 6:
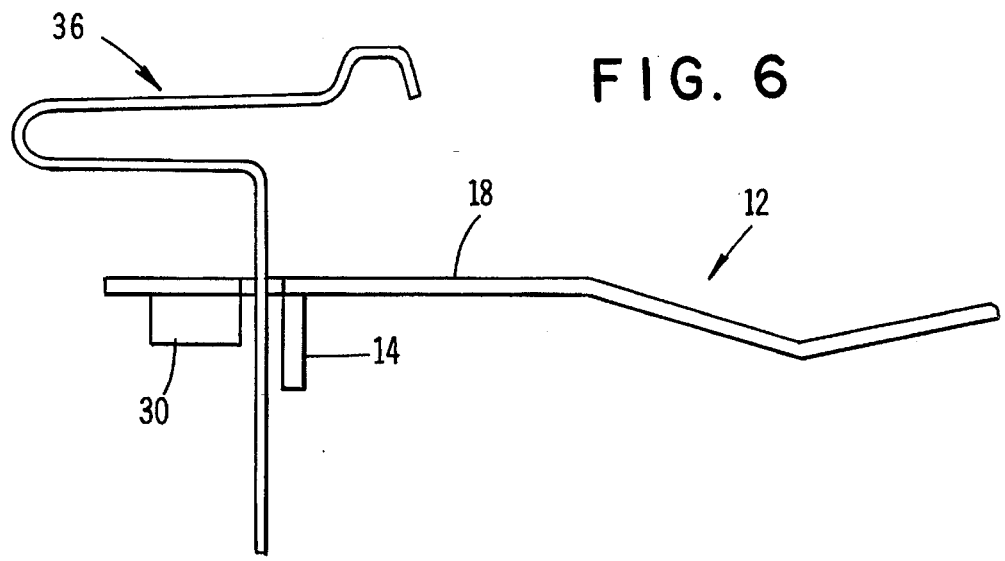
FIG. 6 is an enlarged partial elevational view of the embodiment of the hinge mechanism shown in FIG. 5.

In a second preferred embodiment, shown, for example, in FIGS. 5 and 6, the flaps 14 of the first embodiment are retained. For purposes of illustration only one prong 18 is illustrated in FIGS. 5 and 6. In the second embodiment, a second set of flaps 30 are utilized to secure the separate leg member 36 in the same fashion as the first set of flaps 14. The second set of flaps 30 support the separate leg member 36 on the opposite face from the first set of flaps 14. The second set of flaps 30 extend generally from the surface of the prongs 18 in a direction generally parallel to the length of the elongated leaf spring element 12 and at the inner edge 32 of the prongs. In this embodiment, the location of the second set of flaps 30 must be such that the flaps 30 originate at a point between the end of the prongs 18 and the notches 16, and terminate close to the beginning of the notch 16.

In this embodiment, the slot 38 is generally "T" shaped so as to accommodate the passage of the second set of flaps 30. The width of the extended accommodation 34 of the slot 38 should be just sufficient to allow the second set of flaps 30 to pass therethrough. As the pronged end of the leaf spring element 12 is passed through the separate leg member's slot 38 in this embodiment, the second set of flaps 30 should clear the slot 38 prior to the engagement of the notches 16 with the slot sides 20. When the prongs 18 release after the notches 16 engage the slot sides 20, the second set of flaps 30 move outwardly with the prongs due to their positioning on the inner edges 32 of the prongs. Once released, the second set of flaps 30 expand beyond the opening 34 of the slot 38 and abut the face of the separate leg member 36. With the first set of flaps 14 in contact with and abutting the front face of the separate leg member 36, and the second set of flaps 30 in contact with and abutting the back face of the separate leg member 36, rotation of the separate leg member 36 is controlled. A tab similar to that illustrated at 22 of the first embodiment may, if desired, be added to this embodiment for additional support, where the tab 22 location is on the edge opposite the extension of the slot 34. Because metal is typically removed from both the leg and the free end to form the necessary interengagement mechanism, any of this metal may be formed into tabs or flaps which are attached to one of the leg or the leaf spring, and bear at some contact location, remote from the nominal thickness of the leg or leaf spring, against the other of the leg or leaf spring. In general, the leg and leaf spring are preferably formed from flat spring stock and heat treated after formation. Stock of varying thickness or different profiles may be used, if desired.

Figure 7:
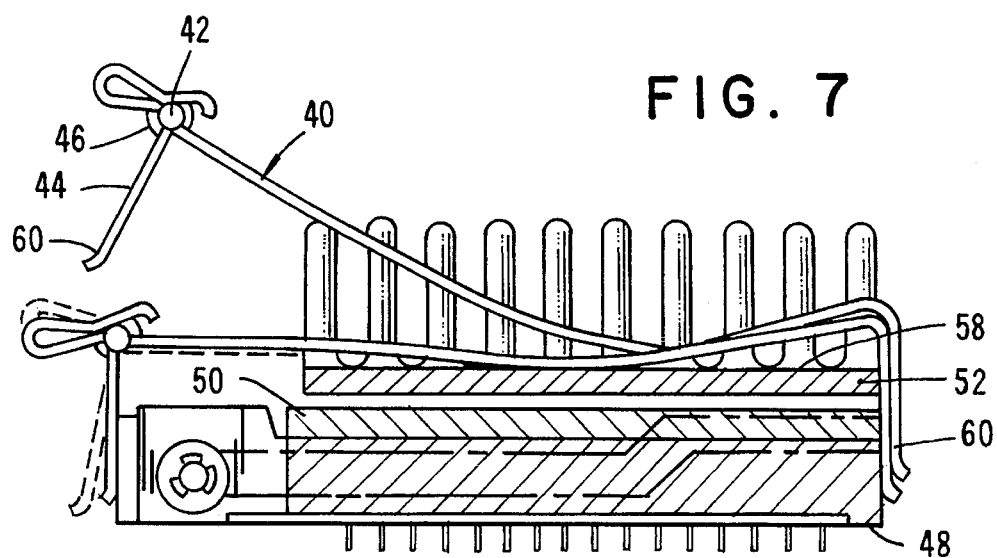
FIG. 7 is a cross-sectional elevational view of a two piece clip of this invention in a heat dissipating assembly.
Figure 8:
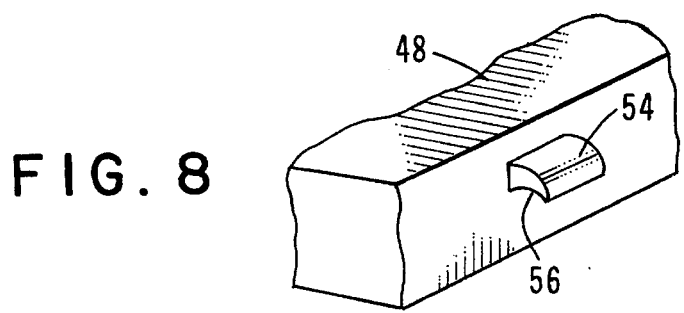
FIG. 8 is a broken perspective view of a typical mounting location on a socket.

Referring, for example, particularly to FIGS. 7 and 8, there is illustrated an additional two piece clip embodiment in which a leaf spring 40 is hingedly mounted at its free end by a hinge pin 42 to a separate leg 44. The hinge is in the form of a conventional hinge with metal tabs from each of the leg and leaf spring curled into a cylindrical socket 46 for hinge pin 42. Rotation between the leg and leaf spring is controlled by the bearing of the respective parts of the socket 46 on the hinge pin 42. A typical heat dissipating assembly is illustrated in which a socket 48 is provided for mounting an electronic chip 50. A heat sink 52 is mounted on one side of the chip 50 by means of the spring clip which includes leaf spring 40 and separate leg 44. The respective ends of the two piece clip are attached to opposite sides of the socket 48 by means of mounting elements 60 (generally ports) which engage mounting locations such as, for example, mounting lug 54, which projects outwardly from a side of socket 48. The lower lip of the mounting ports engage in the undercut 56 of lug 54. the spring clip generally rests on the top surface 58 of heat sink 52.

The length of the separate leg above the hinge location can be adjusted to accommodate various heat sink heights. The length of the leg below the hinge point can be adjusted to accommodate various heat dissipating assemblies.

What has been described are preferred embodiments in which modifications and changes may be made without departing from the spirit and scope of the accompanying claims.

What is claimed is:

1. A two piece clip for use in a heat dissipating assembly, said heat dissipating assembly including a heat conducting body, said heat conducting body having a heat dissipating surface and a heat receiving surface, said heat conducting body being adapted to being mounted in a heat receiving relationship with an electronic device, said electronic device having a heat discharging surface adapted to being positioned adjacent said heat receiving surface, said heat dissipating surface being generally opposed to said heat receiving surface, and said two piece clip being adapted to removably mount said heat conducting body in said heat receiving relationship with said electronic device, said two piece clip comprising:

an elongated leaf spring member, said elongated leaf spring member including a leg segment, said leg segment including a mounting element adapted to engage a first mounting location adjacent a first side of said heat dissipating assembly, said elongated leaf spring member terminating in a free end remote from said mounting element, a separate leg member, said separate leg member and said free end defining therebetween a leg engaging mechanism, said separate leg member and said free end being hingedly engaged with one another by said leg engaging mechanism, whereby said separate leg member is adapted to pivot hingedly through an arc around said free end, said separate leg member including a second mounting element adapted to engage a second mounting location adjacent a second side of said heat dissipating assembly, and a bearing element mounted on a first one of said free end or separate leg member and positioned to bear against the other of said free end or separate leg member at a location spaced from said first one of said free end or separate leg member, said bearing element being adapted to limit the range of said arc.

2. A two piece clip as recited in claim 1 wherein said leg engaging mechanism is comprised of a slot in said separate leg member, said slot being adapted to receive said elongated leaf spring member at said free end, said slot engaging said elongated spring member at said free end to hingedly permit rotation of said second leg engaging mechanism rotating about said free end of said elongated leaf spring member.

3. A two piece clip as recited in claim 1 wherein said bearing element comprises flaps extending generally outwardly from said elongated leaf spring member and adapted to bear on said separate leg member.

4. A two piece clip as recited in claim 1 wherein said separate leg member has a first face and a second face, and bearing elements bearing against both said first and second faces.

5. A two piece clip as recited in claim 1 wherein said bearing element is mounted to said elongated leaf spring member and is adapted to bearing against said separate leg member to limit the rotation of said separate leg member relative to said elongated leaf spring member.

6. A two piece clip as recited in claim 1 wherein said bearing element is mounted to said separate leg member and is adapted to bearing against said elongated leaf spring member to limit the rotation of said separate leg member relative to said elongated leaf spring member.

7. A two piece clip as recited in claim 1 including a plurality of bearing elements.

* * * * *